United States Patent
Takabayashi et al.

(10) Patent No.: US 9,762,034 B2
(45) Date of Patent: Sep. 12, 2017

(54) TUNABLE LASER SOURCE, OPTICAL TRANSMITTER, AND OPTICAL TRANSMITTER AND RECEIVER MODULE

(71) Applicant: FUJITSU LIMITED, Kawasaki-shi, Kanagawa (JP)

(72) Inventors: Kazumasa Takabayashi, Atsugi (JP); Tsuyoshi Yamamoto, Zama (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 15/297,411

(22) Filed: Oct. 19, 2016

(65) Prior Publication Data

US 2017/0040775 A1 Feb. 9, 2017

Related U.S. Application Data

(63) Continuation of application No. PCT/JP2014/061183, filed on Apr. 21, 2014.

(51) Int. Cl.
*H01S 5/50* (2006.01)
*H01S 5/14* (2006.01)
(Continued)

(52) U.S. Cl.
CPC .......... *H01S 5/50* (2013.01); *H01S 5/026* (2013.01); *H01S 5/02248* (2013.01);
(Continued)

(58) Field of Classification Search
None
See application file for complete search history.

(56) References Cited

U.S. PATENT DOCUMENTS

| 4,844,571 A | 7/1989 | Stanley |
| 5,440,576 A | 8/1995 | Welch |

(Continued)

FOREIGN PATENT DOCUMENTS

| JP | H62-285466 | 12/1987 |
| JP | 2003-508927 A1 | 3/2003 |

(Continued)

OTHER PUBLICATIONS

International Search Report for International Application No. PCT/JP2014/061183 dated Jul. 29, 2014.
Written Opinion of the International Searching Authority for International Application No. PCT/JP2014/061183 dated Jul. 29, 2014 (4 Sheets, 2 Sheets translation, 6 Sheets total).

*Primary Examiner* — Armando Rodriguez
(74) *Attorney, Agent, or Firm* — Kratz, Quintos & Hanson, LLP

(57) ABSTRACT

A tunable laser source includes a mirror, a tunable filter, and a semiconductor optical amplifier integrated device including first, second, and third semiconductor optical amplifiers between a first end face facing toward the tunable filter and a second end face facing away from the first end face. The first amplifier is closer to the first end face than the second and third amplifiers. The semiconductor optical amplifier integrated device further includes a partially reflecting mirror and an optical divider that are disposed between the first amplifier and the second and third amplifiers. The partially reflecting mirror is closer to the first amplifier than the optical divider. The optical divider includes first and second branches connected to the second and third semiconductor optical amplifiers, respectively. The tunable filter and the first amplifier are disposed in an optical path between the partially reflecting mirror and the mirror that form a laser resonator.

16 Claims, 14 Drawing Sheets

(51) Int. Cl.
*H01S 5/24* (2006.01)
*H01S 5/022* (2006.01)
*H01S 5/026* (2006.01)
*H01S 5/10* (2006.01)
*H01S 5/12* (2006.01)
*H01S 5/227* (2006.01)
*H01S 5/042* (2006.01)
*H01S 5/00* (2006.01)
*H01S 5/02* (2006.01)
*H01S 5/028* (2006.01)
*H01S 5/22* (2006.01)

(52) U.S. Cl.
CPC .......... *H01S 5/1032* (2013.01); *H01S 5/1209* (2013.01); *H01S 5/141* (2013.01); *H01S 5/142* (2013.01); *H01S 5/2275* (2013.01); *H01S 5/24* (2013.01); *H01S 5/0085* (2013.01); *H01S 5/021* (2013.01); *H01S 5/0287* (2013.01); *H01S 5/0425* (2013.01); *H01S 5/2224* (2013.01); *H01S 5/2226* (2013.01)

(56) References Cited

U.S. PATENT DOCUMENTS

| | | |
|---|---|---|
| 5,539,571 A | 7/1996 | Welch |
| 5,793,521 A | 8/1998 | O'Brien |
| 6,295,308 B1 | 9/2001 | Zah |
| 2005/0053385 A1 | 3/2005 | Nishimura |
| 2007/0046952 A1 | 3/2007 | Kikuchi |
| 2007/0223939 A1 | 9/2007 | Arimoto |
| 2009/0122817 A1 | 5/2009 | Sato |
| 2009/0274187 A1 | 11/2009 | Kudo |
| 2012/0057815 A1 | 3/2012 | Ezaki |
| 2012/0213528 A1 | 8/2012 | Nakagawa |

FOREIGN PATENT DOCUMENTS

| | | |
|---|---|---|
| JP | 2005-84081 A1 | 3/2005 |
| JP | 2007-64860 A1 | 3/2007 |
| JP | 2007-256716 A1 | 10/2007 |
| JP | 2010-177221 A1 | 8/2010 |
| JP | 2012-53399 A1 | 3/2012 |
| JP | 2012-175583 A1 | 9/2012 |
| WO | WO 2007/029647 A1 | 3/2007 |
| WO | WO 2007/080891 A1 | 7/2007 |

TUNABLE LASER SOURCE, OPTICAL TRANSMITTER, AND OPTICAL TRANSMITTER AND RECEIVER MODULE

CROSS-REFERENCE TO RELATED APPLICATION

This application is a continuation application of International Application PCT/JP2014/061183, filed on Apr. 21, 2014, and designating the U.S., the entire contents of which are incorporated herein by reference.

FIELD

A certain aspect of the embodiments discussed herein is related to tunable laser sources, optical transmitters, and optical transmitter and receiver modules.

BACKGROUND

Wavelength multiplexing optical communications systems using coherent modulation such as dual polarization quadrature phase shift keying (DP-QPSK) have been introduced to address an increase in transmission capacity in optical communications. According to DP-QPSK, the transmission capacity per wavelength is 100 Gb/s. To further increase the transmission capacity, a study has been made of optical transmission using coherent modulation techniques capable of transmitting a large amount of information, such as 16 quadrature amplitude modulation (16QAM).

Such coherent modulation techniques capable of transmitting a large amount of information require a spectral linewidth that indicates the amount of wavelength fluctuation of a laser beam emitted from a light source to be narrow. For example, 16QAM requires a spectral linewidth of 100 kHz or less. For example, as a tunable laser source of a narrow linewidth, an external-cavity laser source as depicted in FIG. 1 is proposed (see, for example, International Publication Pamphlet No. WO2007/080891). This external-cavity laser source is a combination of a semiconductor optical amplifier (SOA) 910 that serves as a gain medium, a lens 921, a tunable filter 922, and an external mirror 923. According to the external-cavity laser source structured as described above, an anti-reflective (AR) coating 911 is provided on one end face 910a of the SOA 910, and a partially reflective coating 912 is provided on the other end face 910b of the SOA 910.

Accordingly, a laser resonator (cavity) is formed by the partially reflective coating 912 provided on the other end face 910b and the external mirror 923, and the lens 921 and the tunable filter 922 are disposed in the optical path between the SOA 910 and the external mirror 923. According to this tunable laser source, a laser beam is emitted from the side of the other end face 910b of the SOA 910 on which the partially reflective coating 912 is provided. The spectral linewidth of the emitted laser beam tends to be narrower as the laser resonator becomes longer. External-cavity laser sources, for which it is easy to increase the length of the laser resonator, are suitable to reduce the spectral linewidth and have achieved spectral linewidths of 100 kHz or less.

Furthermore, according to coherent modulation, input signal light input to a receiver that serves as a coherent receiver and local oscillation light having an oscillation wavelength close to the wavelength of the input signal light are caused to interfere with each other to detect a phase modulation signal. Therefore, optical transmitter and receiver modules adopting coherent modulation employ two laser sources, namely, a laser source for output signal light and a laser source for local oscillation light. Specifically, as depicted in FIG. 2, according to optical transmitter and receiver modules adopting coherent modulation, a laser source 931 is provided in a transmitter 930, and a laser source 941 is provided in a receiver 940. A laser beam emitted from the laser source 931 is modulated in a DP-QPSK modulator 932 to be output from the transmitter 930 as an output signal. Furthermore, an input signal input to the receiver 940, together with local oscillation light emitted from the laser source 941, enters a hybrid 942, and light exiting from the hybrid 942 is detected at a light-receiving element 943. The coherent-modulation optical transmitter and receiver module having a structure as depicted in FIG. 2, however, requires two laser sources, and accordingly, is large in size. Therefore, there is a demand for coherent-modulation optical transmitter and receiver modules that are reduced in size.

From such a viewpoint, a coherent-modulation optical transmitter and receiver module using a single laser beam as depicted in FIG. 3 is proposed (see, for example, Japanese Laid-open Patent Publication No. 2007-64860). According to the coherent-modulation optical transmitter and receiver module as depicted in FIG. 3, a laser beam emitted from the laser source 931 is split into signal light and local oscillation light by a beam splitter 933. Specifically, of the laser beam emitted from the laser source 931 to be incident on the beam splitter 933, a part transmitted through the beam splitter 933 becomes signal light, which enters the DP-QPSK modulator 932 to be modulated and is output from the transmitter 930 as an output signal, and a part reflected by the beam splitter 933 becomes local oscillation light, which, together with an input signal input to the receiver 940, enters the hybrid 942. Light exiting from the hybrid 942 is detected at the light-receiving element 943.

Thus, the coherent-modulation optical transmitter and receiver module depicted in FIG. 3 does not require the laser source 941 provided in the receiver 940 of the coherent-modulation optical transmitter and receiver module depicted in FIG. 2, and accordingly, can be reduced in size. According to the coherent-modulation optical transmitter and receiver module depicted in FIG. 3, however, the single laser source 931 is required to emit a laser beam that becomes both signal light and local oscillation light, and accordingly, is required to be capable of emitting a high-power laser beam.

As a laser source capable of emitting a high-power laser beam, a laser source that further includes an SOA provided in the stage subsequent to a laser resonator is proposed (see, for example, International Publication Pamphlet No. WO2007/080891). As depicted in FIG. 4, this laser source is a combination of an SOA integrated device 950, the lens 921, the tunable filter 922, and the external mirror 923. The SOA integrated device 950 includes a first SOA 951, a second SOA 952, and a partially reflecting mirror 953 formed between the first and second SOAs 951 and 952. Furthermore, an AR coating 954 is provided on one end face 950a of the SOA integrated device 950 on the external cavity side, and an AR coating 955 is provided on the other end face 950b of the SOA integrated device 950 through which a laser beam is emitted.

According to the laser source having the above-described structure, a laser resonator is formed by the partially reflecting mirror 953 of the SOA integrated device 950 and the external mirror 923. The lens 921, the tunable filter 922, and the first SOA 951 are disposed in the optical path between the partially reflecting mirror 953 and the external mirror 923. A laser beam transmitted through the partially reflecting mirror 953 is amplified by the second SOA 952 serving as an amplifier. Accordingly, the laser source having the above-described structure can emit a high-power laser beam.

SUMMARY

According to an aspect of the embodiments, a tunable laser source includes a mirror, a tunable filter, and a semiconductor optical amplifier integrated device including first, second, and third semiconductor optical amplifiers between a first end face facing toward the tunable filter and a second end face facing away from the first end face. The first amplifier is closer to the first end face than the second and third amplifiers. The semiconductor optical amplifier integrated device further includes a partially reflecting mirror and an optical divider that are disposed between the first amplifier and the second and third amplifiers. The partially reflecting mirror is closer to the first amplifier than the optical divider. The optical divider includes first and second branches connected to the second and third semiconductor optical amplifiers, respectively. The tunable filter and the first amplifier are disposed in an optical path between the partially reflecting mirror and the mirror that form a laser resonator.

The object and advantages of the embodiments will be realized and attained by means of the elements and combinations particularly pointed out in the claims.

It is to be understood that both the foregoing general description and the following detailed description are exemplary and explanatory and not restrictive of the invention.

DESCRIPTION OF EMBODIMENTS

Figure 4:
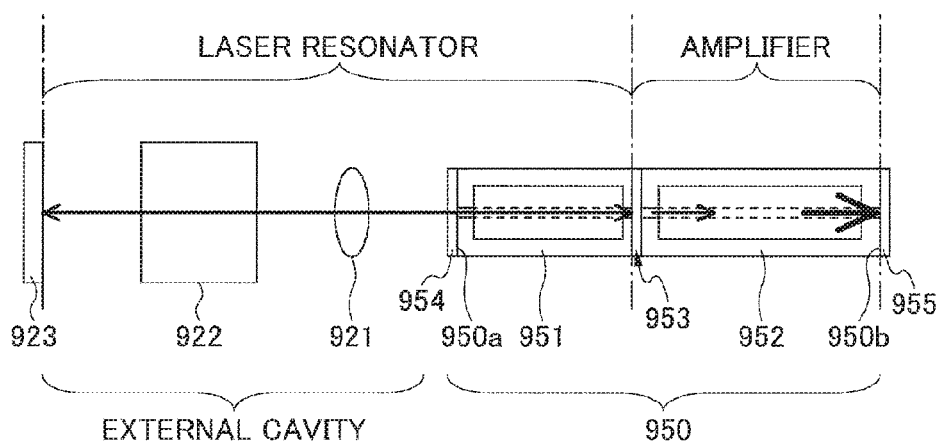
FIG. 4 is a diagram depicting a structure of a laser source of an external-cavity laser.

According to the tunable laser source having the structure as depicted in FIG. 4, when there is residual reflection at the AR coating 955 provided on the other end face 950b, light reflected and returning from the AR coating 955 (returning light) is amplified by the second SOA 952 to enter the laser resonator. There is a general tendency that as the returning light reflected from the AR coating 955 increases, the laser oscillation condition is disturbed to increase the spectral linewidth. Accordingly, as the amplification factor of the second SOA 952 increases to increase the output power of the laser beam, the spectral linewidth of the laser beam increases. That is, according to the laser source having the structure as depicted in FIG. 4, there is a tradeoff between increasing the output power of the laser beam and narrowing the spectral linewidth of the laser beam, so that it is difficult to increase the output power of the laser beam with the spectral linewidth of the laser beam being narrow.

Figure 1:
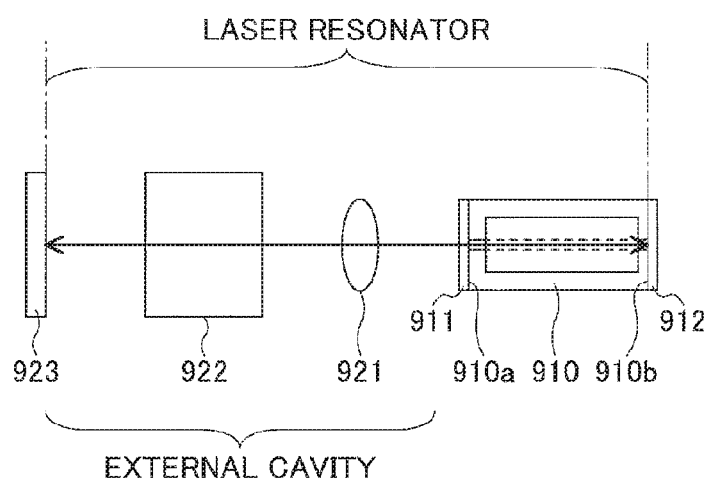
FIG. 1 is a diagram depicting a structure of a laser source of an external-cavity laser.
Figure 2:
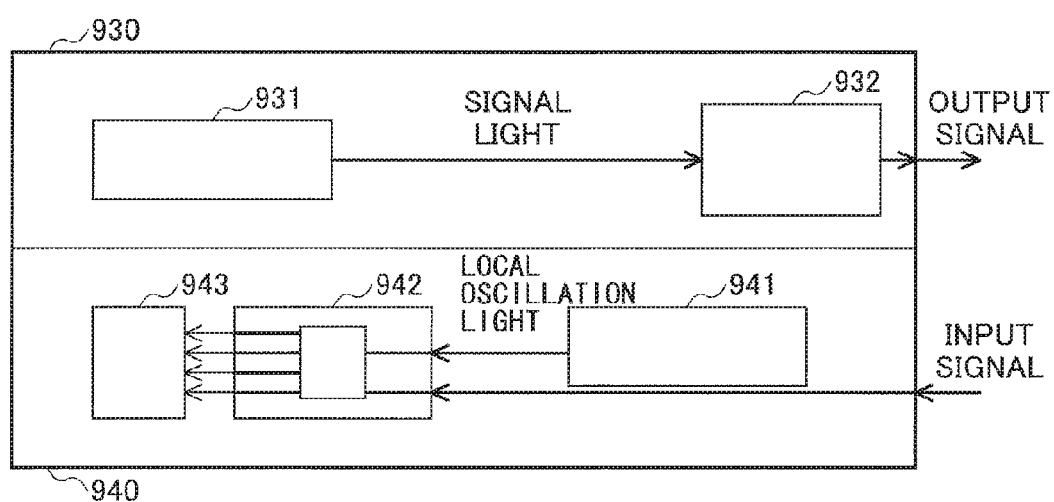
FIG. 2 is a diagram depicting a structure of an optical transmitter and receiver module for coherent communications.
Figure 3:
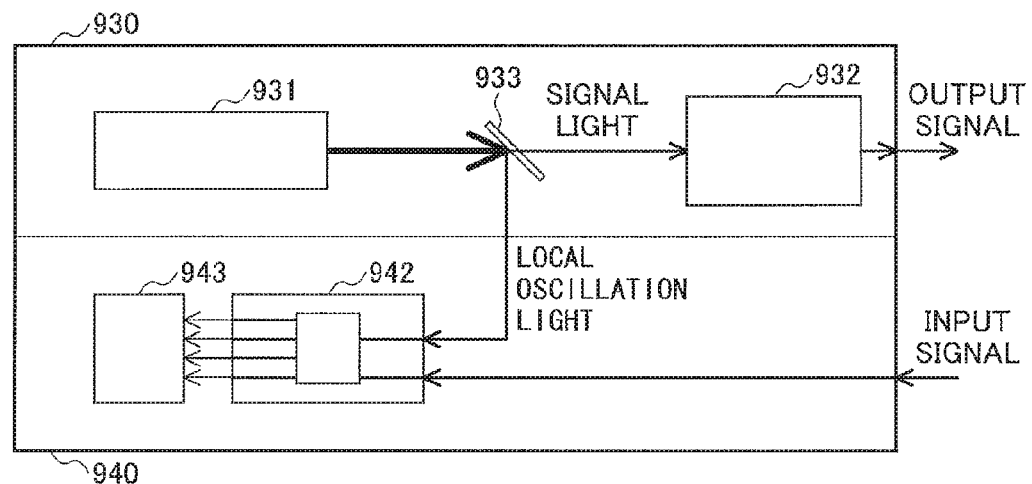
FIG. 3 is a diagram depicting a structure of an optical transmitter and receiver module for coherent communications.

Furthermore, according to optical transmitter and receiver modules, it is preferable to control the output of a laser beam for output signal light and the output of a laser beam for local oscillation light independent of each other. In the case depicted in FIG. 3, however, where the laser beam emitted from the laser source 931 is split into partial laser beams, it is impossible to control the outputs of the partial laser beams independent of each other. Furthermore, in the case of splitting the laser beam in a desired ratio, an attenuator is disposed in the optical path of one of the partial laser beams to attenuate the output power of the one of the partial laser beams. In the case of attenuating a laser beam, however, the required output power of the laser beam emitted from a laser source is increased by the amount to be attenuated. Accordingly, in the case of employing the laser source having the structure as depicted in FIG. 4, the amplification factor of the second SOA 952 is increased. Increasing the amplification factor, however, causes the returning light to exert a significant influence, thus increasing the spectral linewidth.

Therefore, there is a demand for tunable laser sources capable of emitting a high-power laser beam having a narrow spectral linewidth.

According to an aspect of the present invention, a tunable laser source is capable of emitting a high-power laser beam having a narrow spectral linewidth.

Preferred embodiments of the present invention will be explained with reference to accompanying drawings. The same element is referred to using the same reference numeral, and a repetitive description thereof is omitted.

[a] First Embodiment

Figure 5:
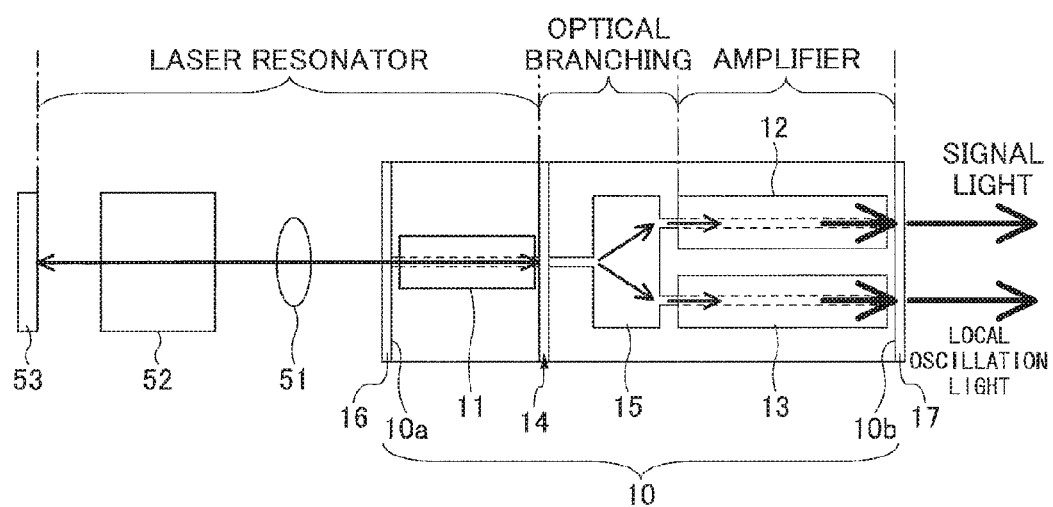
FIG. 5 is a diagram depicting a tunable laser source according to a first embodiment.

A tunable laser source according to a first embodiment is described with reference to FIG. 5. Referring to FIG. 5, the tunable laser source of this embodiment includes an SOA integrated device 10, a lens 51, a tunable filter 52, and an external mirror 53.

The SOA integrated device 10 includes a first SOA 11, a second SOA 12, a third SOA 13, a partially reflecting mirror 14, and an optical divider 15. The partially reflecting mirror 14 and the optical divider 15 are provided between the first SOA 11 and the second and third SOAs 12 and 13. An AR coating 16 is provided on a first end face 10a of the SOA integrated device 10. An AR coating 17 is provided on a second end face 10b of the SOA integrated device 10. That is, in the SOA integrated device 10, the AR coating 16 is provided on the first end face 10a on the side of which the first SOA 11 is formed, and the AR coating 17 is provided on the second end face 10b on the side of which the second SOA 12 and the third SOA 13 are formed.

The partially reflecting mirror 14 of the SOA integrated device 10 and the external mirror 53 form the laser resonator (cavity) of the tunable laser source of this embodiment. The lens 51, the tunable filter 52, and the first SOA 11 are disposed in the optical path between the partially reflecting mirror 14 and the external mirror 53. Part of a laser beam oscillated in the laser resonator including the first SOA 11 exits from the first SOA 11 to be transmitted through the partially reflecting mirror 14 to be incident on the optical divider 15. The optical divider 15 is a 1×2 multi-mode interference (MMI) splitter, and includes two branches, of which one connects to the second SOA 12 and the other connects to the third SOA 13, so that the laser beam incident on the optical divider 15 is branched (divided) into two laser beams. Of the two laser beams into which the laser beam is thus branched in the optical divider 15 and which exit from the optical divider 15, one enters the second SOA 12 and the other enters the third SOA 13.

The laser beam entering the second SOA 12 is amplified as desired in the second SOA 12 to be emitted from the second end face 10b of the SOA integrated device 10 through the AR coating 17 as signal light. The laser beam entering the third SOA 13 is amplified as desired in the third SOA 13 to be emitted from the second end face 10b of the SOA integrated device 10 through the AR coating 17 as local oscillation light.

Figure 6A:
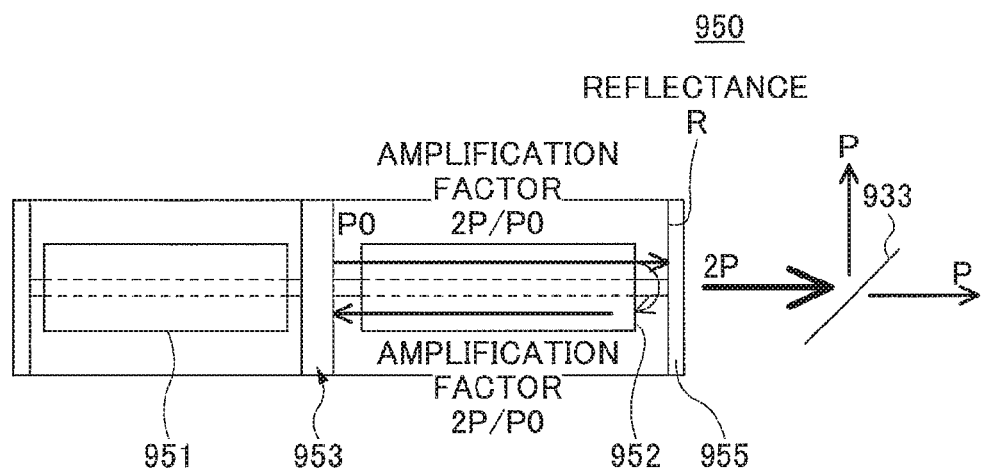
FIGS. 6A and 6B are diagrams depicting SOA integrated devices.

Compared with the tunable laser source depicted in FIG. 4, the tunable laser source of this embodiment can reduce the influence of the returning light by half on average, and accordingly, can reduce an increase in the spectral linewidth due to the returning light. This is described in more detail with reference to FIGS. 6A, 6B and 7. FIG. 6A depicts the case of the SOA integrated device 950 of the tunable laser source depicted in FIG. 4. According to the SOA integrated device 950, a laser beam generated in the laser resonator formed by the external mirror 923 (FIG. 4) and the partially reflecting mirror 953 enters the second SOA 952 through the partially reflecting mirror 953. Here, it is assumed that the power of the laser beam entering the second SOA 952 through the partially reflecting mirror 953 be P0. According to this tunable laser source, in order to obtain the power P of signal light and the power P of local oscillation light, the power of the laser beam emitted from the SOA integrated device 950 through the AR coating 955 is required to be 2P. Therefore, the amplification factor of the second SOA 952 is 2P/P0. Furthermore, as described above, the AR coating 955 in the SOA integrated device 950 is difficult to make completely free of reflection, and slightly reflects light. It is assumed that the reflectance of the AR coating 955 is R. The returning light reflected from the AR coating 955 is amplified by the second SOA 952 to be incident on the partially reflecting mirror 953.

Accordingly, the power of the returning light incident on the partially reflecting mirror 953 is given by (the power of the laser beam entering the second SOA 952)×(the amplification factor of the second SOA 952)× (the reflectance of the AR coating 955)×(the amplification factor of the second SOA 952), namely, P0× (2P/P0)× R× (2P/P0)=4RP$^2$/P0. That is, according to the SOA integrated device 950 depicted in FIG. 6A, a laser beam whose power is 4RP$^2$/P0 is made incident on the partially reflecting mirror 953 as returning light. The laser beam thus returning to be incident on the partially reflecting mirror 953 is transmitted at a predetermined transmittance to enter the laser resonator to be amplified.

Figure 6B:
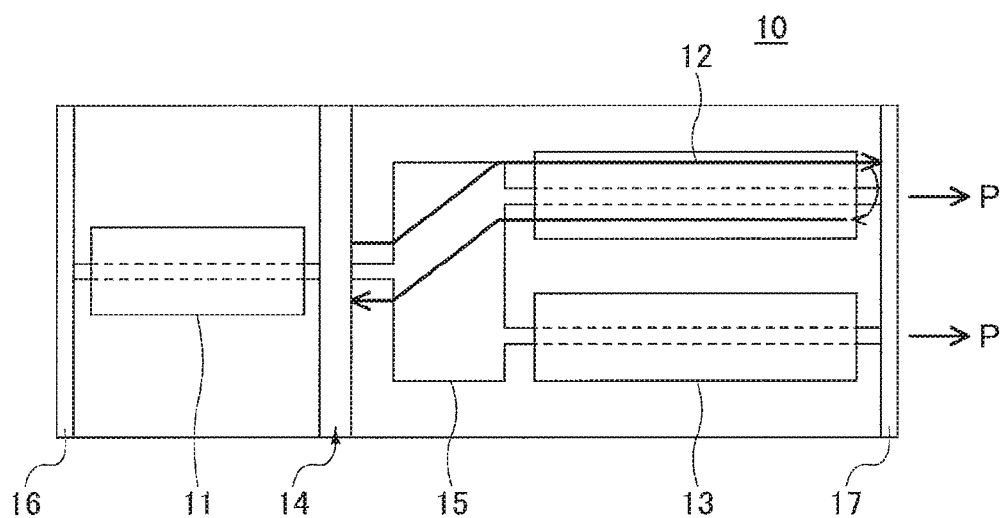

FIG. 6B depicts the case of the SOA integrated device 10 of the tunable laser source of this embodiment as depicted in FIG. 5. According to the SOA integrated device 10, a laser beam generated in the laser resonator formed by the external mirror 53 (FIG. 5) and the partially reflecting mirror 14 enters the optical divider 15 through the partially reflecting mirror 14. Here, it is assumed that the power of the laser beam made incident on the optical divider 15 through the partially reflecting mirror 14 be P0. The laser beam of the power P0 incident on the optical divider 15 is divided into laser beams (divisional laser beams) in a ratio of 1:1 in the optical divider 15. Therefore, the divisional laser beams enter the second SOA 12 and the third SOA 13 each with a power of P0/2. Therefore, according to the tunable laser source of this embodiment, in order to obtain the power P of signal light and the power P of local oscillation light, the amplification factor of each of the second SOA 12 and the third SOA 13 is 2P/P0.

Letting the reflectance R of the AR coating 17 in the SOA integrated device 10 be R, the returning light from the AR coating 17 is amplified in the second SOA 12 and the third SOA 13 to be divided in a ratio of 1:1 in the optical divider 15 to be incident on the partially reflecting mirror 14. Accordingly, the average power of the returning light is the total of the power of the returning light from the second SOA 12 and the power of the returning light from the third SOA 13, given by (the power of the laser beam made incident on the optical divider 15)×(the division ratio of the optical divider 15)×(the amplification factor of the second SOA 12 or the third SOA 13)×(the reflectance of the AR coating 17)×(the amplification factor of the second SOA 12 or the third SOA 13)×(the division ratio of the optical divider 15)×(the number of SOAs). Specifically, the power of the returning light made incident on the partially reflecting mirror 14 is given by P0×(1/2)×(2P/P0)×R×(1/2)×(2P/P0)× 2=2RP$^2$/P0. That is, according to the SOA integrated device 10 employed in the tunable laser source of this embodiment as depicted in FIG. 6B, a laser beam whose power is 2RP$^2$/P0 is made incident on the partially reflecting mirror 14 as returning light. The laser beam thus returning to be incident on the partially reflecting mirror 14 is transmitted at a predetermined transmittance to enter the laser resonator to be amplified. Therefore, according to the tunable laser source according to this embodiment, the power of the returning light entering the laser resonator can be half of that of the tunable laser source depicted in FIG. 4. When the two returning light beams match in phase in the optical divider 15, the power of the returning light may be substantially the same as in the case depicted in FIG. 6A, but otherwise, the power of the returning light is lower than in the case depicted in FIG. 6A. Therefore, the power of the returning light is substantially the same as in the case depicted in FIG. 6B on average.

Figure 7:
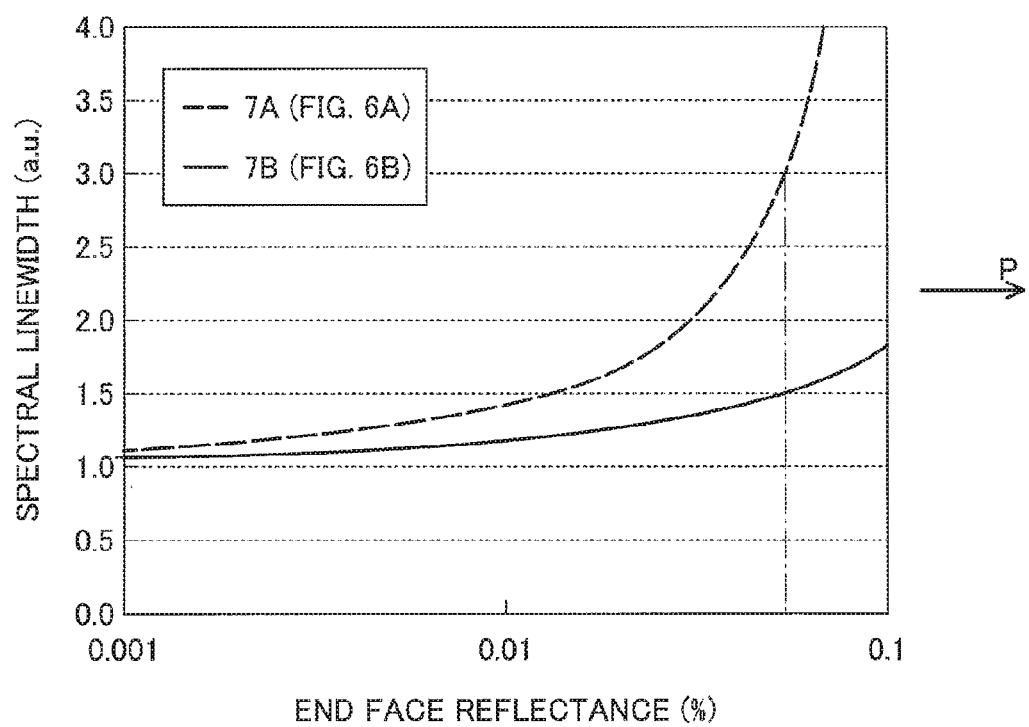
FIG. 7 is a graph representing the relationship between the reflectance of an end face and the spectral linewidth of a laser beam in the SOA integrated devices.

Next, the relationship between the reflectance of an end face and the spectral linewidth of a laser beam is described with reference to FIG. 7. Specifically, a description is given of the relationship between the reflectance of an end face and the spectral linewidth of a laser beam in the tunable laser source employing the SOA integrated device 950 depicted in FIG. 6A and the tunable laser source of this embodiment employing the SOA integrated device 10 depicted in FIG. 6B. FIG. 7 graphically represents results obtained by calculations. In FIG. 7, the dashed line indicates a characteristic 7A of the tunable laser source employing the SOA integrated device 950 depicted in FIG. 6A, and the solid line indicates a characteristic 7B of the tunable laser source of this embodiment employing the SOA integrated device 10 depicted in FIG. 6B. The reflectance of an end face ("end face reflectance") in FIG. 7 is the reflectance of an end face from which a laser beam is emitted. That is, the end face reflectance in FIG. 7 is the reflectance of the end face 950b (FIG. 4) on which the AR coating 955 is provided in the SOA integrated device 950 depicted in FIG. 6A and is the reflectance of the second end face 10b (FIG. 5) on which the AR coating 17 is provided in the SOA integrated device 10 depicted in FIG. 6B. Furthermore, in the calculations, the amplification factor of the second SOA 952 of the SOA integrated device 950 depicted in FIG. 6A is 10, and the amplification factor of each of the second SOA 12 and third SOA 13 of the SOA integrated device 10 depicted in FIG. 6B is 10. In addition, in FIG. 7, when an end face reflectance of 0, the spectral linewidth is normalized as 1.

Referring to FIG. 7, when the end face reflectance is 0.05% (indicated by the one-dot chain line), the spectral linewidth of the tunable laser source employing the SOA integrated device 950 depicted in FIG. 6A is approximately three times that at an end face reflectance of 0 as indicated by the characteristic 7A, while the spectral linewidth of the tunable laser source of this embodiment employing the SOA integrated device 10 depicted in FIG. 6B is approximately 1.5 times that at an end face reflectance of 0 as indicated by the characteristic 7B. Accordingly, when the end face reflectance is 0.05%, the spectral linewidth of the tunable laser source of this embodiment employing the SOA integrated device 10 depicted in FIG. 6B is approximately half the spectral linewidth of the tunable laser source employing the SOA integrated device 950 depicted in FIG. 6A.

Figure 8:
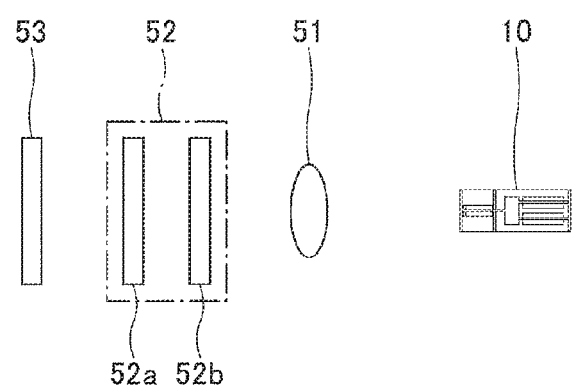
FIG. 8 is a diagram depicting the tunable laser source according to the first embodiment.

Next, the tunable laser source of this embodiment is described in more detail. FIG. 8 is a diagram depicting constituent parts or members of the tunable laser source of this embodiment almost in life size. The tunable laser source of this embodiment is a combination of the SOA integrated device 10, the lens 51, the tunable filter 52, and the external mirror 53.

According to this embodiment, as depicted in FIG. 8, the tunable filter 52 includes two etalons that are minutely different in free spectral range (FSR) from each other, namely, a first etalon 52a and a second etalon 52b. The tunable filter 52 can variably tune to a desired wavelength because of the Vernier effect due to the combination of the first etalon 52a and the second etalon 52b. A beam of parallel rays is required to be incident on the first etalon 52a and the second etalon 52b in the tunable filter 52. Therefore, a lens 51 such as a collimator lens is disposed between the tunable filter 52 and the SOA integrated device 10. The tunable filter 52 and the lens 51 are disposed in the optical path between the external mirror 53 and the SOA integrated device 10. The external mirror 53 can reflect light transmitted through the tunable filter 52 and cause the reflected light to re-enter the tunable filter 52 to return to the SOA integrated device 10.

Figure 9:
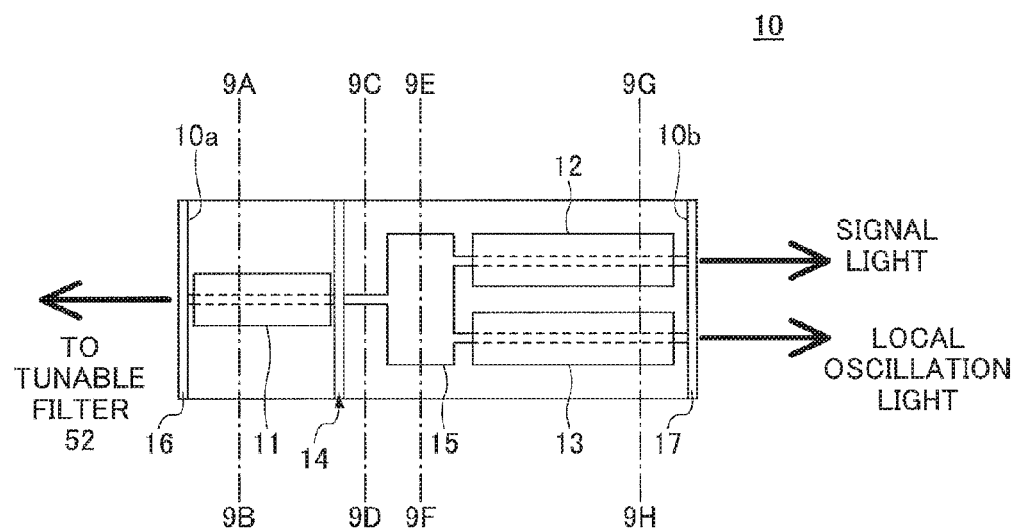
FIG. 9 is a plan view of the SOA integrated device according to the first embodiment.

Referring to FIG. 9, the SOA integrated device 10 includes the first SOA 11, the second SOA 12, and the third SOA 13. The partially reflecting mirror 14 and the optical divider 15 are disposed between the first SOA 11 and the second and third SOAs 12 and 13. The AR coating 16 is provided on the first end face 10a of the SOA integrated device 10. The AR coating 17 is provided on the second end face 10b of the SOA integrated device 10. That is, in the SOA integrated device 10, the AR coating 16 is provided on the first end face 10a on the side of which the first SOA 11 is formed, and the AR coating 17 is provided on the second end face 10b on the side of which the second SOA 12 and the third SOA 13 are formed. A 1×2 MMI splitter is employed as the optical divider 15.

Light entering the SOA integrated device 10 through the first end face 10a travels through the first SOA 11 to be incident on the partially reflecting mirror 14. Part of the light made incident on the partially reflecting mirror 14 is reflected to again travel through the first SOA 11 to exit from the SOA integrated device 10 through the first end face 10a. The light exiting from the SOA integrated device 10 then travels through the lens 51 to be transmitted through the tunable filter 52 to be incident on and reflected from the external mirror 53. Of the light made incident on the partially reflecting mirror 14, a part that is not reflected is transmitted through the partially reflecting mirror 14 as a laser beam to be incident on the optical divider 15 to be divided into two laser beams. Of the two laser beams into which the laser beam is divided in the optical divider 15, one enters the second SOA 12, and the other enters the third SOA 13. The laser beam entering the second SOA 12 is amplified in the second SOA 12 to be emitted through the second end face 10b of the SOA integrated device 10 as signal light. The laser beam entering the third SOA 13 is amplified in the third SOA 13 to be emitted through the second end face 10b of the SOA integrated device 10 as local oscillation light.

According to this embodiment, the external mirror 53 and the partially reflecting mirror 14 of the SOA integrated device 10 form a laser resonator, and the first SOA 11 of the SOA integrated device 10 serves as a laser gain medium.

Figure 10:
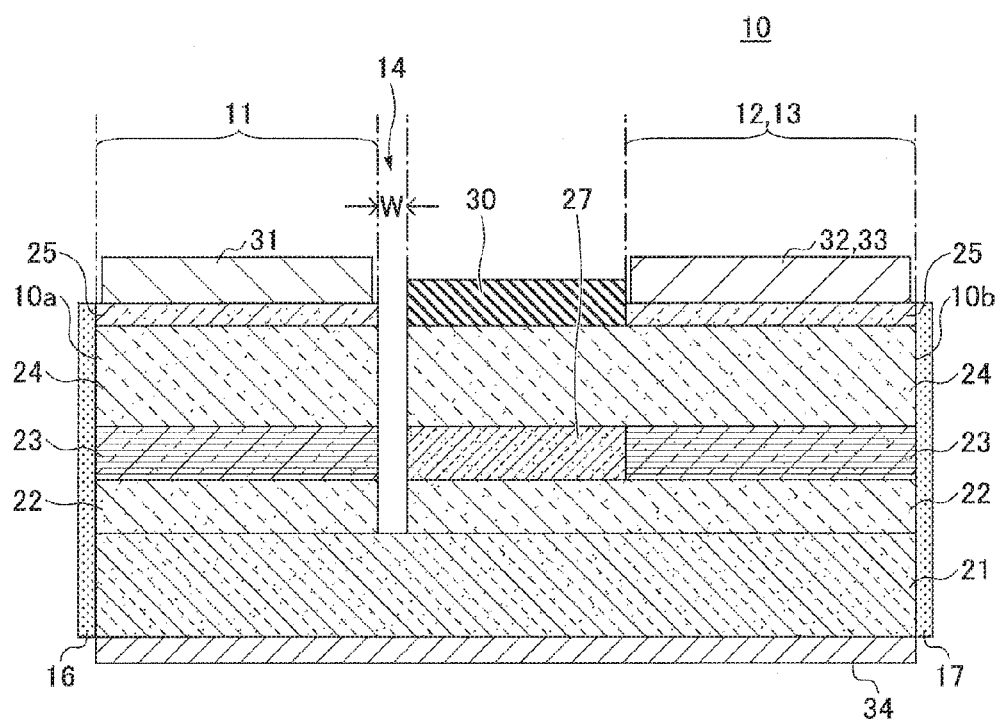
FIG. 10 is a cross-sectional view of the SOA integrated device according to the first embodiment.
Figure 11A:
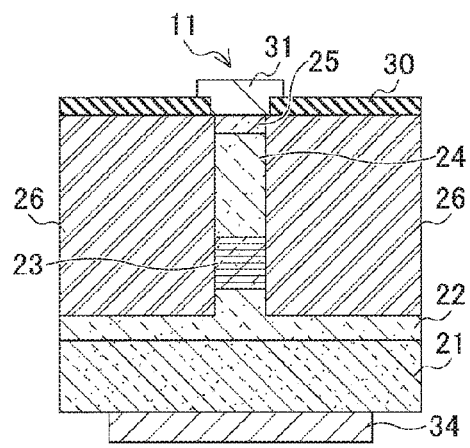
FIGS. 11A through 11D are cross-sectional views of the SOA integrated device according to the first embodiment.
Figure 11B:
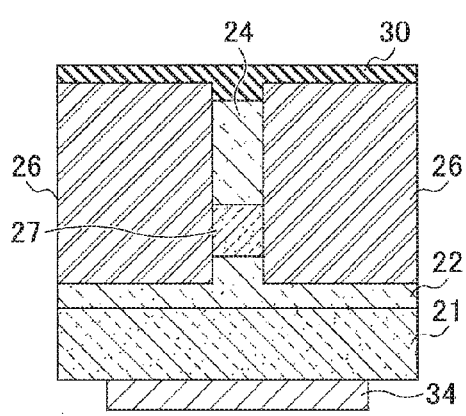
Figure 11C:
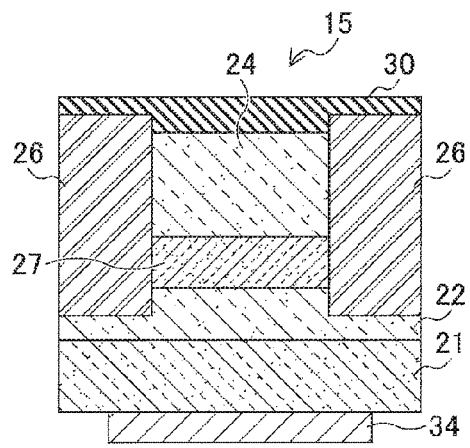
Figure 11D:
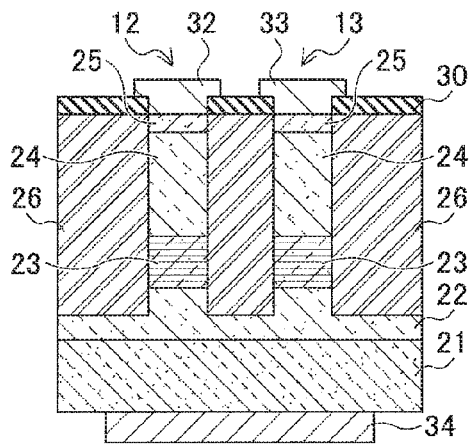

Next, a structure of the SOA integrated device 10 according to this embodiment is described with reference to FIGS. 10, 11A, 11B, 11C and 11D. FIG. 10 is a cross-sectional view of the SOA integrated device 10 depicted in FIG. 9, taken along an optical path in which light travels. FIG. 11A is a cross-sectional view of the SOA integrated device 10 depicted in FIG. 9, taken along the one-dot chain line 9A-9B. FIG. 11B is a cross-sectional view of the SOA integrated device 10 depicted in FIG. 9, taken along the one-dot chain line 9C-9D. FIG. 11C is a cross-sectional view of the SOA integrated device 10 depicted in FIG. 9, taken along the one-dot chain line 9E-9F. FIG. 11D is a cross-sectional view of the SOA integrated device 10 depicted in FIG. 9, taken along the one-dot chain line 9G-9H.

According to the SOA integrated device 10 of this embodiment, the first SOA 11, the second SOA 12, the third SOA 13, the optical divider 15, etc., are formed on an n-InP substrate 21, which is a semiconductor substrate.

Referring to FIGS. 10 and 11A, semiconductor layers are stacked on the n-InP substrate 21 to form the first SOA 11 in a region of the SOA integrated device 10. Specifically, a lower n-InP cladding layer 22, a multiple quantum well (MQW) active layer 23, an upper p-InP cladding layer 24, and a contact layer 25 are stacked on the n-InP substrate 21. According to the first SOA 11, part of the lower n-InP cladding layer 22, the MQW active layer 23, the upper p-InP cladding layer 24, and the contact layer 25 are formed into a mesa structure having an optical waveguide width of 2.0 μm. A semi-insulating InP (SI-InP) layer 26 doped with, for example, Fe, is provided (buried) on each side of the mesa structure to form an embedded waveguide structure. The MQW active layer 23 is formed of InGaAsP, and the composition ratio and the thickness of the MQW active layer 23 are controlled to obtain gain in the 1.55 μm band. The contact layer 25 is formed of, for example, p-InGaAsP/p-InGaAs. A first electrode 31 is formed on the contact layer 25. A silicon oxide film is formed on the SI-InP layer 26 as a protection film 30.

Referring to FIGS. 10 and 11D, semiconductor layers are stacked on the n-InP substrate 21 to form the second SOA 12 and the third SOA 13 in a region of the SOA integrated device 10. Specifically, the lower n-InP cladding layer 22, the MQW active layer 23, the upper p-InP cladding layer 24, and the contact layer 25 are stacked on the n-InP substrate 21. According to the second SOA 12 and the third SOA 13, part of the lower n-InP cladding layer 22, the MQW active layer 23, the upper p-InP cladding layer 24, and the contact layer 25 are formed into a mesa structure having an optical waveguide width of 2.0 μm. The SI-InP layer 26 doped with, for example, Fe, is provided (buried) on each side of the mesa structure to form an embedded waveguide structure. A second electrode 32 is formed on the contact layer 25 in a region where the second SOA 12 is formed. A third electrode 33 is formed on the contact layer 25 in a region where the third SOA 13 is formed. A silicon oxide film is formed on the SI-InP layer 26 as the protection film 30. A bottom electrode 34 to serve as a lower electrode is formed on the bottom surface of the n-InP substrate 21. The first electrode 31, the second electrode 32, and the third electrode 33 serve as upper electrodes to allow an electric current to flow between the lower electrode and each upper electrode.

Referring to FIGS. 10 and 11C, semiconductor layers are stacked on the n-InP substrate 21 to form the optical divider 15 in a region of the SOA integrated device 10. Specifically, the lower n-InP cladding layer 22, a waveguide core layer 27, and the upper p-InP cladding layer 24 are stacked on the n-InP substrate 21. According to the optical divider 15, part of the lower n-InP cladding layer 22, the waveguide core layer 27, and the upper p-InP cladding layer 24 are formed into a mesa structure having an optical waveguide width of 8.0 μm. The waveguide core layer 27 is formed of InGaAsP. In order to reduce the absorption of a transmitted laser beam of the 1.55 μm band, the composition ratio, etc., of the waveguide core layer 27 are so controlled that the band gap wavelength of the waveguide core layer 27 is 1.3 μm. The optical divider 15 is formed to be 60 μm in length. The SI-InP layer 26 doped with, for example, Fe, is provided (buried) on each side of the mesa structure. The waveguide core layer 27 is wider in the optical divider 15 than in the below-described optical waveguide. As a result, the waveguide core layer 27 in the optical divider 15 can serve as an optical divider to equally divide an incident layer beam into two laser beams. A silicon oxide film is formed on the upper p-InP cladding layer 24 and the SI-InP layer 26 as the protection film 30.

Referring to FIGS. 10 and 11B, the lower n-InP cladding layer 22, the waveguide core layer 27, and the upper p-InP cladding layer 24 are stacked on the n-InP substrate 21 in regions where the optical waveguide is formed, such as the region between the partially reflecting mirror 14 and the optical divider 15. In these regions, a mesa structure is so formed that the waveguide core layer 27 has a width of 2.0 μm. The SI-InP layer 26 doped with, for example, Fe, is provided (buried) on each side of the mesa structure. A silicon oxide film is formed on the upper p-InP cladding layer 24 and the SI-InP layer 26 as the protection film 30.

According to this embodiment, the partially reflecting mirror 14 is formed between the first SOA 11 and the optical divider 15. The partially reflecting mirror 14 is formed by removing the lower n-InP cladding layer 22, the MQW active layer 23 or the waveguide core layer 27, and the upper p-InP cladding layer 24 formed on the n-InP substrate 21 for a predetermined width W, for example, a width of approximately 1 μm, to form a groove. By thus forming a groove to expose an end face of the MQW active layer 23, it is possible to form an etched mirror to form the partially reflecting mirror 14. Because of the difference in refractive index from, for example, air at the end face of the MQW active layer 23 in the groove, the partially reflecting mirror 14 thus formed reflects part of the incident light and transmits the rest of the incident light that is not reflected at the end face. Preferably, the partially reflecting mirror 14 is formed by dry etching such as reactive ion etching (RIE).

According to this embodiment, it is possible to independently apply forward voltage between the bottom electrode 34 and the first electrode 31, between the bottom electrode 34 and the second electrode 32, and between the bottom electrode 34 and the third electrode 33. Therefore, the first SOA 11, the second SOA 12, and the third SOA 13 can be injected with an electric current independent of one another. Accordingly, it is possible to control the power of a laser beam emitted from the second SOA 12 and the power of a laser beam emitted from the third SOA 13 independent of each other. As a result, it is possible to amplify a laser beam with a desired amplification factor without unnecessarily amplifying the laser beam in each of the second SOA 12 and the third SOA 13. Therefore, according to this embodiment, it is possible to reduce the influence of returning light reflected from the AR coating 17, and accordingly, to control an increase in the spectral linewidth of the laser beam.

Figure 12:
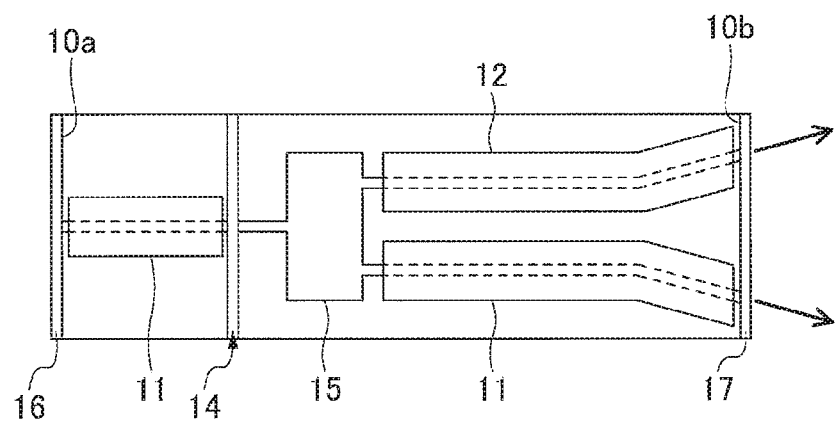
FIG. 12 is a diagram depicting a first variation of the SOA integrated device according to the first embodiment.

A first variation of the first embodiment is described. Referring to FIG. 12, the SOA integrated device 10 used as a tunable laser source according to this embodiment may have the exit port of a laser beam in each of the second SOA 12 and the third SOA 13 inclined relative to a normal to the second end face 10b of the SOA integrated device 10. In this case, the exit port of a laser beam in the second SOA 12 and the exit port of a laser beam in the third SOA 13 may be inclined in opposite directions relative to a normal to the second end face 10b. By thus inclining the exit port relative to a normal to the second end face 10b, it is possible to reduce returning light from the second end face 10b and to easily separate laser beams emitted from the second SOA 12 and the third SOA 13.

Figure 13:
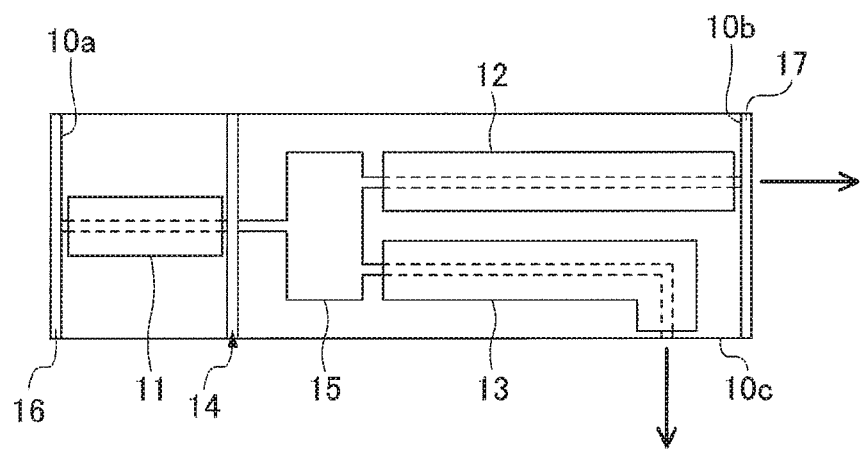
FIG. 13 is a diagram depicting a second variation of the SOA integrated device according to the first embodiment.

Next, a second variation according to the first embodiment is described. Referring to FIG. 13, the SOA integrated device 10 used as a tunable laser source according to this embodiment may have the exit port of a laser beam in the second SOA 12 and the exit port of a laser beam in the third SOA 13 formed at different end faces of the SOA integrated device 10. For example, the exit port of a laser beam in the second SOA 12 may be formed at the second end face 10b of the SOA integrated device 10, and the exit port of a laser beam in the third SOA 13 may be formed at a longitudinally extending end face 10c of the SOA integrated device 10 that is different from the second end face 10b. As a result, it is possible to dispose a modulator close to the exit port of a laser beam in the second SOA 12 and to dispose a receiver close to the exit port of a laser beam in the third SOA 13, so that it is possible to prevent the modulator and the receiver from positionally interfering with each other.

Furthermore, according to this embodiment, the exit port of a laser beam is not limited to, for example, the second end face 10b. For example, an etched mirror formed to be inclined at 45°, a grating coupler, etc., may serve as respective exit ports to emit laser beams from a surface of the n-InP substrate 21. Furthermore, the SOA integrated device 10 according to this embodiment is not limited to the buried waveguide structure as described above, and may have a ridge waveguide structure. Furthermore, according to this embodiment, while the tunable filter 52 is described above as being formed of two etalons by way of example, a tunable filter having any configuration may be employed as the tunable filter 52 to achieve the same effects as in this embodiment.

[b] Second Embodiment

Figure 14:
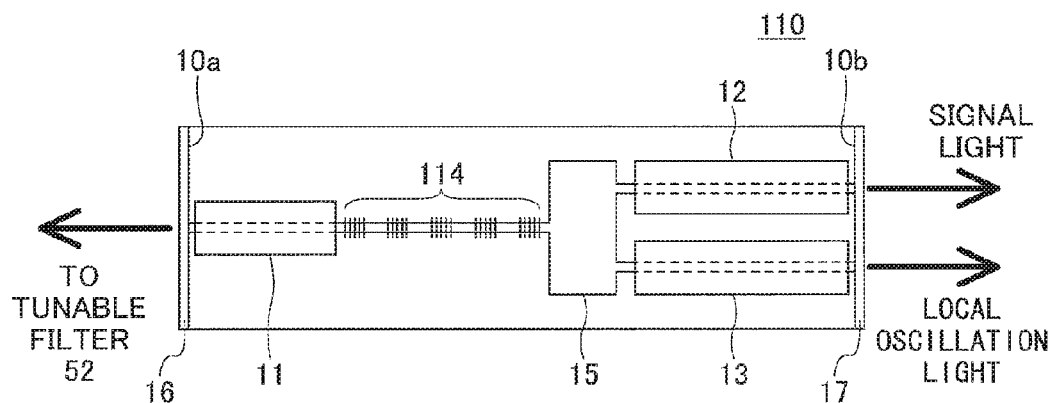
FIG. 14 is a plan view of an SOA integrated device according to a second embodiment.
Figure 15:
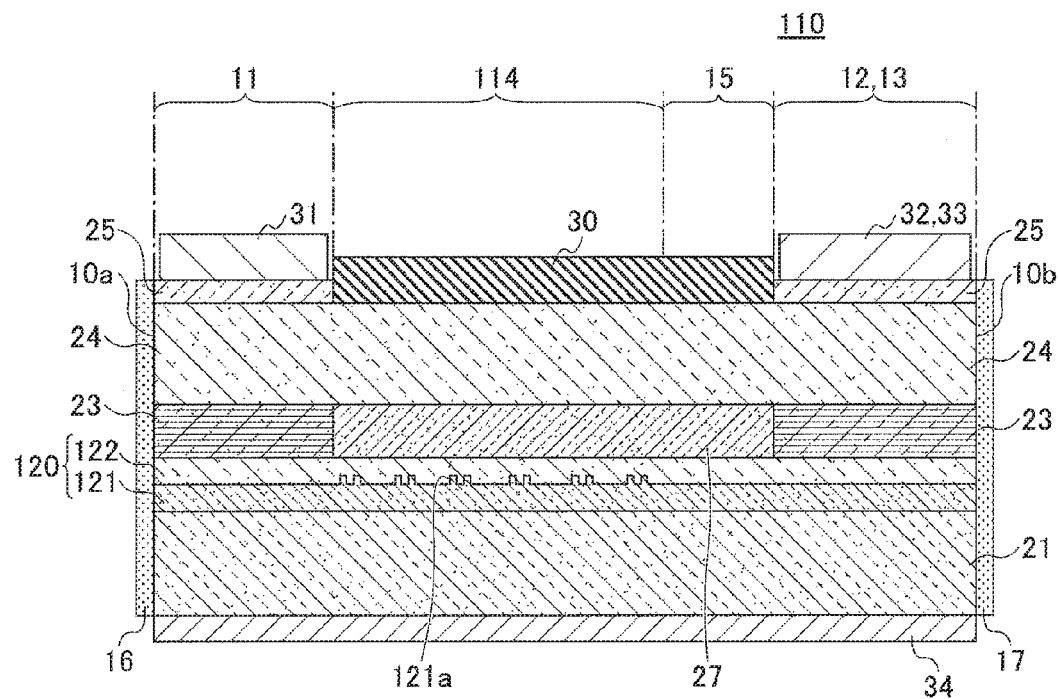
FIG. 15 is a cross-sectional view of the SOA integrated device according to a second embodiment.

Next, a second embodiment is described. This embodiment is directed to a laser source including an SOA integrated device whose partially reflecting mirror is formed of a distributed Bragg reflector (DBR). Referring to FIGS. 14 and 15, the partially reflecting mirror of an SOA integrated device 110 of this embodiment is formed of a sampled grating-distributed Bragg reflector (SG-DBR) 114. FIG. 15 is a cross-sectional view of the SOA integrated device 110, taken along an optical path in which light travels. According to a tunable laser source of this embodiment, the partially reflecting mirror may alternatively be formed of a superstructure grating-distributed Bragg reflector (SSG-DBR).

According to this embodiment, the SG-DBR 114 is formed between the first SOA 11 and the optical divider 15. The SG-DBR 114 is formed of a diffraction grating 121a having a periodic structure below the waveguide core layer 27. Referring to FIG. 15, specifically, an InGaAsP layer 121 having the diffraction grating 121a formed in its surface is formed on the n-InP substrate 21, and an InP layer 122 is formed on the InGaAsP layer 121. The diffraction grating 121a formed in the surface of the InGaAsP layer 121 is formed only in the region between the first SOA 11 and the optical divider 15 where the SG-DBR 114 is formed.

The refractive index differs between InGaAsP and InP. Therefore, by forming the InP layer 122 on the InGaAsP layer 121 having the diffraction grating 121a formed in its surface, it is possible to form the SG-DBR 114 that reflects part of light of a predetermined wavelength and transmits the rest of the light. According to this embodiment, the InGaAsP layer 121 and the InP layer 122 form a lower cladding layer 120. The diffraction grating 121a is not formed in the surface of the InGaAsP layer 121 in the region other than the region where the SG-DBR 114 is formed.

The SG-DBR 114 has a periodic reflection spectrum with respect to light wavelengths. Therefore, in the case of using two etalons as the tunable filter 52, it is possible to combine wavelength selection due to periodic wavelength reflection by the SG-DBR 114 with wavelength selection due to the Vernier effect by the two etalons. As a result, it is possible to perform sharper wavelength selection, and accordingly, to achieve a tunable laser with high single-mode characteristics.

The above description is given of the case of using the SG-DBR 114, while, for example, a simple DBR having a wide reflection band may be used according to this embodiment. In this case, wavelength selection is performed only with the tunable filter 52 the same as in the first embodiment. Furthermore, the diffraction grating 121a may alternatively be formed in the upper p-InP cladding layer 24 in lieu of the lower cladding layer 120.

The tunable laser source according to this embodiment includes the SOA integrated device 110 of this embodiment and the lens 51, the tunable filter 52, and the external mirror 53 that are employed in the first embodiment.

In other respects than those described above, the second embodiment may be the same as the first embodiment.

[c] Third Embodiment

Next, a third embodiment is described. This embodiment is directed to an optical transmitter and receiver module that employs the tunable laser source according to this embodiment. The optical transmitter and receiver module according to this embodiment may alternatively employ the tunable laser source according to the second embodiment.

Figure 16:
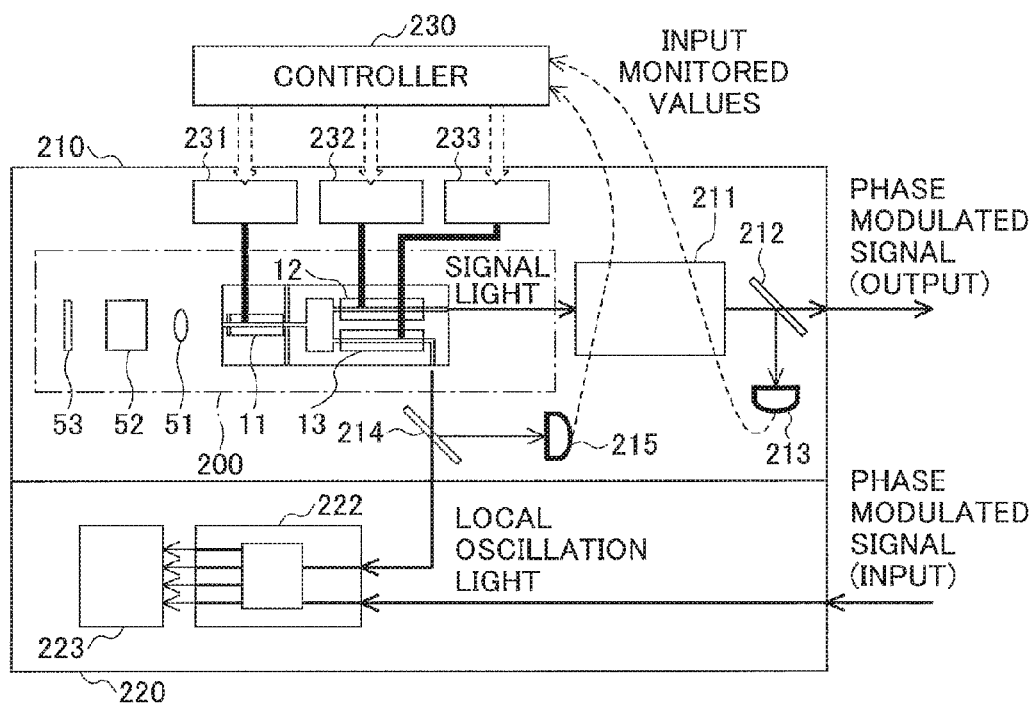
FIG. 16 is a diagram depicting a structure of an optical transmitter and receiver module according to a third embodiment.

Referring to FIG. 16, the optical transmitter and receiver module according to this embodiment employs coherent modulation, and includes a transmitter 210, a receiver 220 to serve as a coherent receiver, and a controller 230. The transmitter 210 includes a tunable laser source 200 according to the first embodiment, a DP-QPSK modulator 211 that is a coherent optical modulator, a first beam splitter 212, a first light-receiving element 213, a second beam splitter 214, and a second light-receiving element 215. The transmitter 210 further includes a first power supply 231, a second power supply 232, and a third power supply 233. The receiver 220 includes a 90° hybrid 222 and a receiver light-receiving element 223.

The first power supply 231 supplies an electric current to the first SOA 11. The second power supply 232 supplies an electric current to the second SOA 12. The third power supply 233 supplies an electric current to the third SOA 13. The first power supply 231, the second power supply 232, and the third power supply 233 are controlled independent of one another by the controller 230.

In the transmitter 210, the tunable laser source 200 emits signal light from the second SOA 12 of the SOA integrated device 10, and emits a laser beam to serve as local oscillation light from the third SOA 13 of the SOA integrated device 10.

The signal light emitted from the second SOA 12 in the tunable laser source 200 enters the DP-QPSK modulator 211 to be modulated to exit from the DP-QPSK modulator 211. The modulated laser beam exiting from the DP-QPSK modulator 211 is made incident on the first beam splitter 212 to be divided into a laser beam transmitted through the first beam splitter 212 and a laser beam reflected from the first beam splitter 212. The laser beam transmitted through the first beam splitter 212 is output from the optical transmitter and receiver module of this embodiment as a phase modulated signal that is an output signal. Furthermore, the laser beam reflected from the first beam splitter 212 enters the first light-receiving element 213, which detects the intensity (power) of the laser beam. The intensity of the laser beam detected at the first light-receiving element 213 is transmitted to the controller 230 as an electrical signal. The controller 230 controls the second power supply 232 based on the detected intensity received from the first light-receiving element 213, so that the signal light emitted from the second SOA 12 has a desired intensity. Accordingly, the second power supply 232 can control an electric current supplied to the second SOA 12 to amplify the laser beam to be emitted from the second SOA 12 with a desired amplification factor.

Furthermore, the laser beam to serve as local oscillation light emitted from the third SOA 13 in the tunable laser source 200 is made incident on the second beam splitter 214. The second beam splitter 214 splits the incident laser beam into a laser beam transmitted through the second beam splitter 214 and a laser beam reflected from the second beam splitter 214. The laser beam transmitted through the second beam splitter 214, together with an input signal input to the optical transmitter and receiver module, which is a phase modulated signal, enters the hybrid 222 in the receiver 220 as local oscillation light. In the receiver 220, the output light of the hybrid 222 is detected by the receiver light-receiving element 223.

Furthermore, the laser beam reflected from the second beam splitter 214 enters the second light-receiving element 215, which detects the intensity (power) of the laser beam. The intensity of the laser beam detected at the second light-element 215 is transmitted to the controller 230 as an electrical signal. The controller 230 controls the third power supply 233 based on the detected intensity received from the second light-receiving element 215, so that the signal light emitted from the third SOA 13 has a desired intensity. Accordingly, the third power supply 233 can control an electric current supplied to the third SOA 13 to amplify the laser beam to be emitted from the third SOA 13 with a desired amplification factor.

According to the optical transmitter and receiver module of this embodiment, components such as the tunable laser source 200, the second beam splitter 214, and the second light-receiving element 215 may be included in a single package. Using such packaged components facilitates assembly of the optical transmitter and receiver module, thus making it possible to shorten the manufacturing process.

Furthermore, according to the optical transmitter and receiver module of this embodiment, a laser beam emitted from the tunable laser source 200 has a narrow spectral linewidth. Therefore, even in the case of employing an advanced coherent modulation technique such as 16QAM, it is possible to achieve low-noise signal transmission. Furthermore, according to this embodiment, it is possible to control a laser beam exiting from the DP-QPSK modulator 211 to serve as an output and a laser beam to serve as local oscillation light by controlling an electric current supplied to the second SOA 12 and an electric current supplied to the third SOA 13 independent of each other.

According to this embodiment, an optical fiber or the like may be provided between the second beam splitter 214 and the hybrid 222. Furthermore, while the above description is given of the case where the first light-receiving element 213 is disposed in the stage subsequent to the DP-QPSK modulator 211 and the second light-receiving element 215 is disposed in the stage preceding the receiver 220, this embodiment is not limited to this configuration. For example, the first light-receiving element 213 may be disposed in the stage preceding the DP-QPSK modulator 211 to control the intensity of a laser beam entering the DP-QPSK modulator 211. Furthermore, the second light-receiving element 215 may be disposed in the receiver 220. Furthermore, the intensity of the laser beam reflected from the second beam splitter 214 may be monitored using the receiver light-receiving element 223. The second light-receiving element 215 may not only monitor the intensity of a laser beam but also serve as a wavelength locker. In this case, for example, the wavelength of the tunable laser source 200 may be controlled by monitoring the local oscillation light with the second light-receiving element 215 with the second SOA 12 on the DP-QPSK modulator 211 side being turned off to emit no laser beam. The laser beam can thus be tuned to a desired wavelength before exiting from the DP-QPSK modulator 211. This makes it possible to prevent the occurrence of a problem such as the interference of a laser beam exiting from the DP-QPSK modulator 211 with a signal of another wavelength in a wavelength multiplexing communications system due to the exiting laser beam's inclusion of a laser beam of a wavelength other than a desired wavelength.

[d] Fourth Embodiment

Figure 17A:
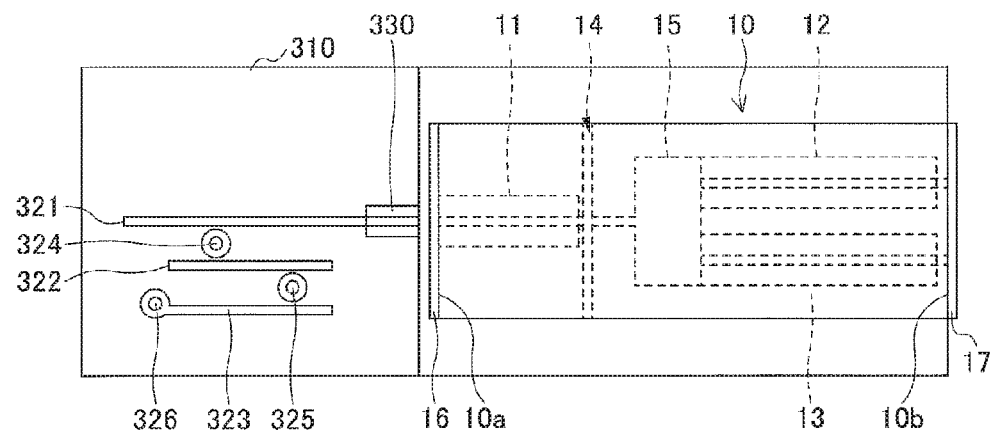
FIGS. 17A and 17B are diagrams depicting a tunable laser source according to a fourth embodiment.
Figure 17B:
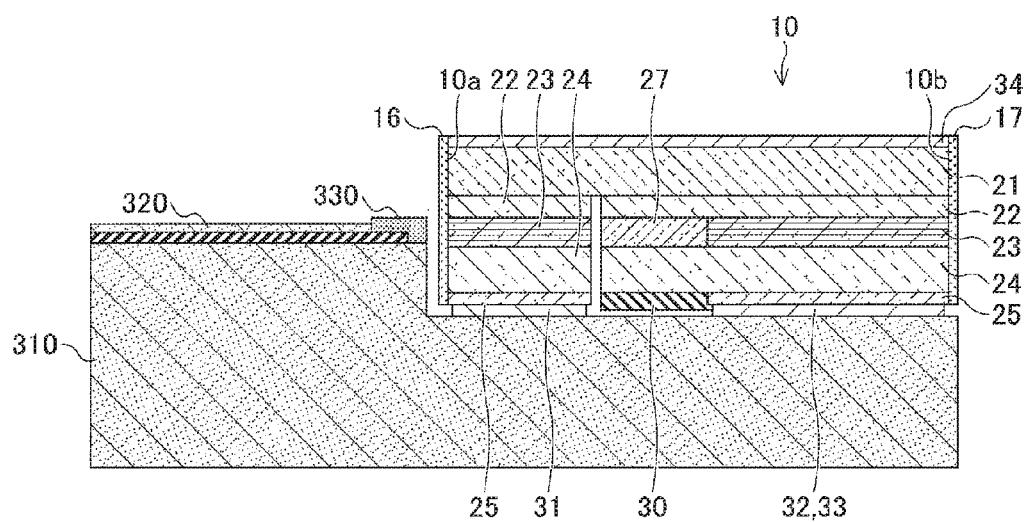

Next, a fourth embodiment is described. According to the fourth embodiment, a laser source is formed on a single chip. A tunable laser source according to this embodiment is described with reference to FIGS. 17A and 17B. FIG. 17A is a plan view of a tunable laser source according to this embodiment. FIG. 17B is a cross-sectional view of the tunable laser source of this embodiment, taken along an optical path in which light travels. According to this embodiment, the tunable laser source employs the SOA integrated device 10 of the first embodiment. Alternatively, however, the tunable laser source may employ the SOA integrated device 110 of the second embodiment.

According to this embodiment, a structure having functions corresponding to the lens 51, the tunable filter 52, and the external mirror 53 of the first embodiment is formed in a surface of a silicon substrate 310. The SOA integrated device 10 is disposed on a terrace formed by removing part of the silicon substrate 310 with the first electrode 31, the second electrode 32, and the third electrode 33 facing the silicon substrate 310 and the bottom electrode 34 facing upward (away from the silicon substrate 310). A silicon waveguide 320 and an input waveguide 330 are formed in the surface of the silicon substrate 310. The input waveguide 330 includes a spot-size converter (SSC). The SOA integrated device 10 is so disposed that light from the input waveguide 330 enters the MQW active layer 23 at the first end face 10a, that is, the MQW active layer 23 of the first SOA 11.

The silicon waveguide 320 formed in the surface of the silicon substrate 310 forms a first optical waveguide 321, a second optical waveguide 322, a third optical waveguide 323, a first ring resonator 324, a second ring resonator 325, and a loop mirror 326. The input waveguide 330 is connected to one end of the first optical waveguide 321. The first ring resonator 324 is disposed between the first optical waveguide 321 and the second optical waveguide 322. The second ring resonator 325 is disposed between the second optical waveguide 322 and the third optical waveguide 323. The loop mirror 326 is connected to one end of the third optical waveguide 323.

Each of the first ring resonator 324 and the second ring resonator 325 is a wavelength filter that transmits periodic wavelengths. The first ring resonator 324 and the second ring resonator 325 slightly differ in diameter to have minutely different wavelength transmission intervals. This makes it possible to selectively transmit light of a single wavelength because of the Vernier effect due to the two ring resonators, namely, the first ring resonator 324 and the second ring resonator 325. Heater electrodes (not depicted) are provided on waveguides in the first ring resonator 324 and the second ring resonator 325. By supplying an electric current to the heater electrodes to heat the waveguides, it is possible to vary the refractive indexes of the waveguides. As a result, it is possible to shift the wavelengths transmitted by the first ring resonator 324 and the second ring resonator 325, so that it is possible to select a wavelength as desired.

According to this embodiment, light exiting from the SOA integrated device 10 enters the input waveguide 330 to be transmitted through the first optical waveguide 321, the first ring resonator 324, the second optical waveguide 322, the second ring resonator 325, and the third optical waveguide 323 in this order to be reflected from the loop mirror 326. The light reflected from the loop mirror 326 is transmitted through the third optical waveguide 323, the second ring resonator 325, the second optical waveguide 322, the first ring resonator 324, and the first optical waveguide 321 in this order, and exits from the input waveguide 330 to enter the SOA integrated device 10.

The first ring resonator 324 and the second ring resonator 325 serve as a wavelength selecting filter (tunable filter), and the loop mirror 326 serves as an external mirror. Accordingly, the loop mirror 326 and the partially reflecting mirror 14 of the SOA integrated device 10 form a laser resonator.

The laser beam transmitted through the partially reflecting mirror 14 to exit outside the laser resonator is divided by the optical divider 15 to enter each of the second SOA 12 and the third SOA 13 the same as in the first embodiment. The laser beams entering the second SOA 12 and the third SOA 13 are amplified with respective desired amplification factors to be emitted from the SOA integrated device 10.

According to the tunable laser source of this embodiment, it is possible to reduce the spectral linewidth and to control the outputs of two emitted laser beams independent of each other the same as in the first embodiment. Furthermore, a structure corresponding to a tunable filter and an external mirror is formed by the silicon waveguide 320 formed in the surface of the silicon substrate 310. Accordingly, it is possible to reduce the size of the tunable laser source.

[e] Fifth Embodiment

Figure 18A:
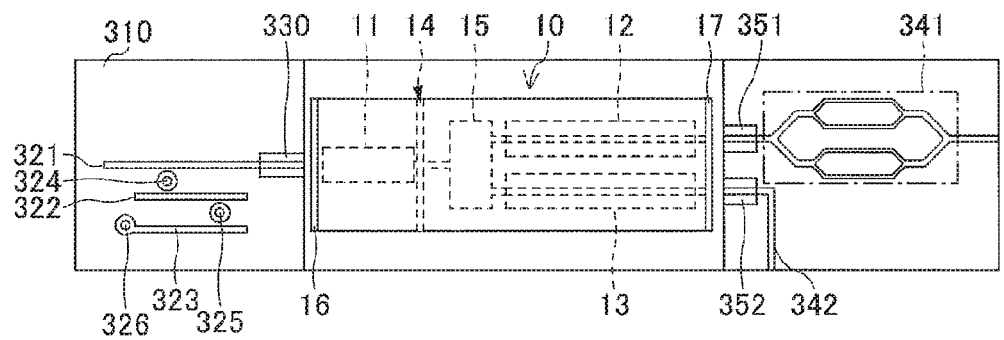
FIGS. 18A and 18B are diagrams depicting a tunable laser source according to a fifth embodiment.
Figure 18B:
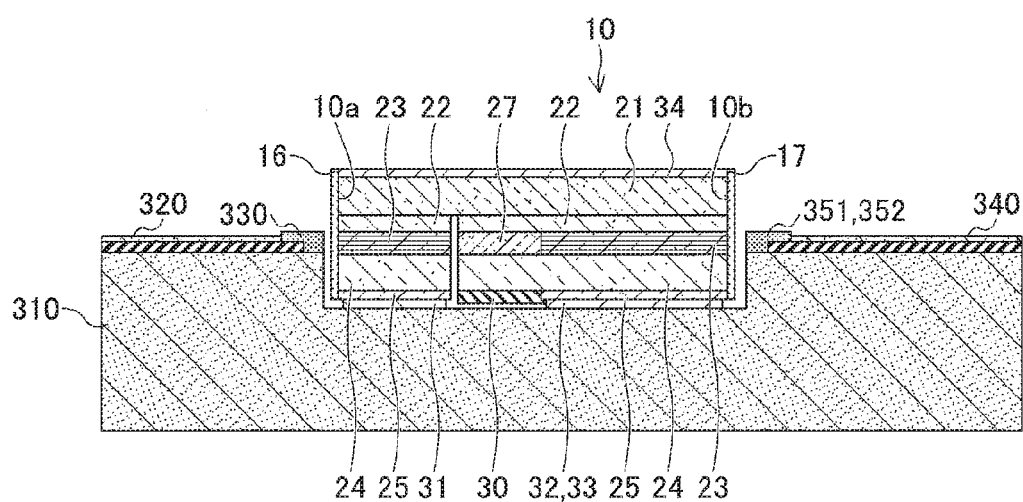

Next, a fifth embodiment is described with reference to FIGS. 18A and 18B. The fifth embodiment is directed to an optical transmitter where a QPSK modulator is further formed by a silicon waveguide in the surface of the silicon substrate 310 employed in the tunable laser source of the fourth embodiment. FIG. 18A is a plan view of an optical transmitter including a tunable laser source and a QPSK modulator according to this embodiment. FIG. 18B is a cross-sectional view of the optical transmitter of this embodiment, taken along an optical path in which light travels. According to this embodiment, the SOA integrated device 10 of the first embodiment is employed. Alternatively, however, the SOA integrated device 110 of the second embodiment may be employed.

According to this embodiment, the silicon waveguide 320 forms the first optical waveguide 321, the second optical waveguide 322, the third optical waveguide 323, the first ring resonator 324, the second ring resonator 325, and the loop mirror 326. The silicon waveguide 320 is formed in the surface of the silicon substrate 310 on the first end face 10a side of the SOA integrated device 10. The input waveguide 330 is connected to one end of the first optical waveguide 321. The first ring resonator 324 is disposed between the first optical waveguide 321 and the second optical waveguide 322. The second ring resonator 325 is disposed between the second optical waveguide 322 and the third optical waveguide 323. The loop mirror 326 is connected to one end of the third optical waveguide 323.

Furthermore, a silicon waveguide 340, a first emission-side input waveguide 351, and a second emission-side input waveguide 352 are formed in the surface of the silicon substrate 310 on the second end face 10b side of the SOA integrated device 10. Each of the first emission-side input waveguide 351 and the second emission-side input waveguide 352 includes an SSC. According to this embodiment, the silicon waveguide 340 forms a QPSK modulator 341 (a coherent optical modulator) connected to the first emission-side input waveguide 351, and forms a receiver-side optical waveguide 342 connected to the second emission-side input waveguide 352.

The SOA integrated device 10 is so disposed that a laser beam emitted from the second SOA 12 enters the first emission-side input waveguide 351 and a laser beam emitted from the third SOA 13 enters the second emission-side input waveguide 352 at the second end face 10b. The SOA integrated device 10 is disposed with the first electrode 31, the second electrode 32, and the third electrode 33 facing the silicon substrate 310 and the bottom electrode 34 facing upward (away from the silicon substrate 310).

The QPSK modulator 341 includes a parent Mach-Zehnder interferometer that includes two child Mach-Zehnder modulators. The laser beam emitted from the second SOA 12 of the SOA integrated device 10 enters the QPSK modulator 341 through the first emission-side input waveguide 351 to be modulated in the QPSK modulator 341 to be output as an output signal.

The laser beam emitted from the third SOA 13 of the SOA integrated device 10 is transmitted through the receiver-side optical waveguide 342 via the second emission-side input waveguide 352 to exit from the receiver-side optical waveguide 342 as local oscillation light.

According to this embodiment, the QPSK modulator 341 is further formed in the surface of the silicon substrate 310 of the tunable laser source of the fourth embodiment. Accordingly, the optical transmitter and receiver module can be smaller than in the case of using the tunable laser source of the fourth embodiment.

According to this embodiment, while the above description is given of the case of forming the QPSK modulator 341 with the silicon waveguide 340 formed in the silicon substrate 310, it is also possible to form a coherent receiver including a 90° hybrid waveguide and a photodiode with the silicon waveguide 340 formed in the silicon substrate 310. In this case, the laser beam emitted from the third SOA 13 of the SOA integrated device 10 may be transmitted through the receiver-side optical waveguide 342 from the second emission-side input waveguide 352 to enter the input side of the 90° hybrid waveguide formed with the silicon waveguide 340 formed in the silicon substrate 310 as local oscillation light. According to this configuration, because the receiver 220 (FIG. 16) is also formed in the surface of the silicon substrate 310, it is possible to further reduce the size of the optical transmitter and receiver module.

Figure 19:
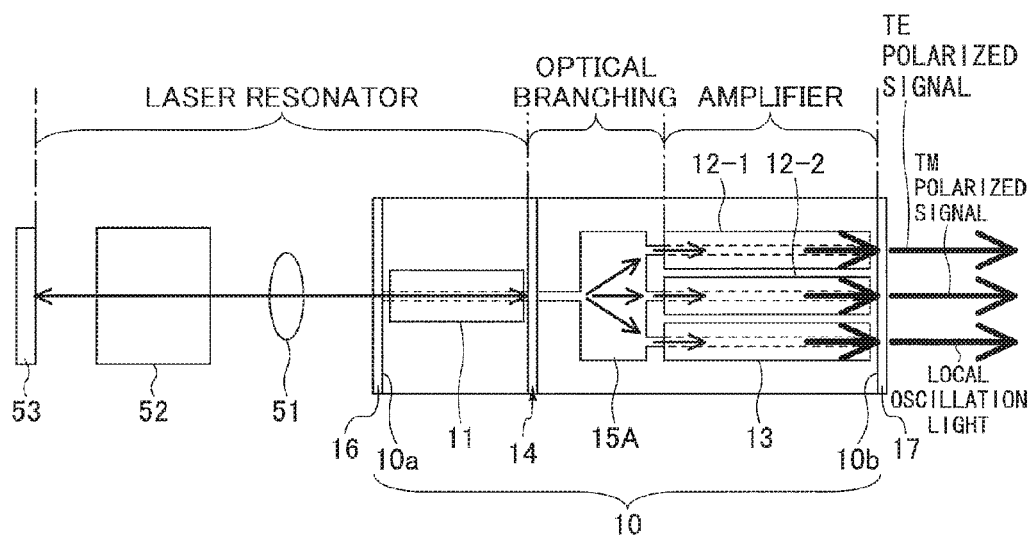
FIG. 19 is a diagram depicting a tunable laser source configured to produce three optical outputs according to an embodiment.

According to the above-described embodiments, while the tunable laser source is configured to produce two optical outputs, namely, one for signal light and the other for local oscillation light, the tunable laser source may alternatively be configured to produce three optical outputs. Examples of tunable laser sources configured to produce three optical outputs include a tunable laser source for polarization multiplexing coherent communications configured to produce an optical output for a TE polarized signal, an optical output for a TM polarized signal, and an optical output for local oscillation signal. FIG. 19 is a diagram depicting a tunable laser source configured to produce three optical outputs according to an embodiment. Referring to FIG. 19, the tunable laser source may have the same configuration as the tunable laser source of FIG. 5 except for including an optical divider 15A in lieu of the optical divider 15 and including an SOA 12-1 and an SOA 12-2 in lieu of the second SOA 12. The optical divider 15a is a 1×3 splitter that divides a laser beam into three laser beams, which enter the SOA 12-1, the SOA 12-1, and the third SOA 13 to be emitted as a TE polarized signal, a TM polarized signal, and local oscillation light, respectively. That is, according to the tunable laser source as depicted in FIG. 19, the SOA integrated device 10 includes four SOAs. Such tunable laser sources can control the intensity of the TE polarized signal and the intensity of the TM polarized signal independent of each other, and accordingly, can correct the intensity difference between the TE polarized signal and the TM polarized signal to transmit a polarization multiplexing signal with more accuracy.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. A tunable laser source, comprising:
   a mirror;
   a tunable filter; and
   a semiconductor optical amplifier integrated device having a first end face facing toward the tunable filter and a second end face facing away from the first end face, the semiconductor optical amplifier integrated device including
      a first semiconductor optical amplifier, a second semiconductor optical amplifier, and a third semiconductor optical amplifier that are disposed between the first end face and the second end face, the first semiconductor optical amplifier being closer to the first end face than the second and third semiconductor optical amplifiers;
      a partially reflecting mirror; and
      an optical divider including a first branch connected to the second semiconductor optical amplifier and a second branch connected to the third semiconductor optical amplifier,
   wherein the partially reflecting mirror and the optical divider are disposed between the first semiconductor optical amplifier and the second and third semiconductor optical amplifiers, the partially reflecting mirror being closer to the first semiconductor optical amplifier than the optical divider,
   wherein the partially reflecting mirror and the mirror form a laser resonator, and
   wherein the tunable filter and the first semiconductor optical amplifier are disposed in an optical path between the partially reflecting mirror and the mirror.

2. The tunable laser source as claimed in claim 1, wherein the semiconductor optical amplifier integrated device includes a semiconductor substrate and a plurality of semiconductor layers stacked on the semiconductor substrate, and
   a groove is formed in the plurality of semiconductor layers between the first semiconductor optical amplifier and the optical divider to expose an end face of an active layer of the first semiconductor optical amplifier, the end face serving as the partially reflecting mirror.

3. The tunable laser source as claimed in claim 2, wherein each of the first, second, and third semiconductor optical amplifiers has a layered structure of a first cladding layer stacked on the semiconductor substrate, the active layer stacked on the first cladding layer, and a second cladding layer stacked on the active layer, and
   the optical divider has a layered structure of the first cladding layer stacked on the semiconductor substrate, a waveguide core layer stacked on the first cladding layer, and the second cladding layer stacked on the waveguide core layer.

4. The tunable laser source as claimed in claim 2, further comprising:
   a bottom electrode on a surface of the semiconductor substrate facing away from the plurality of semiconductor layers;
   a first electrode on the first semiconductor optical amplifier;
   a second electrode on the second semiconductor optical amplifier; and
   a third electrode on the third semiconductor optical amplifier,
   wherein the second semiconductor optical amplifier and the third semiconductor optical amplifier are configured to be independently supplied with an electric current from the second electrode and the third electrode, respectively.

5. The tunable laser source as claimed in claim 1, wherein the partially reflecting mirror is a distributed Bragg reflector including a diffraction grating formed in a semiconductor layer of the semiconductor optical amplifier integrated device.

6. The tunable laser source as claimed in claim 5, wherein each of the first, second, and third semiconductor optical amplifiers has a layered structure of a first cladding layer stacked on a semiconductor substrate, an active layer stacked on the first cladding layer, and a second cladding layer stacked on the active layer,
   the optical divider has a layered structure of the first cladding layer stacked on the semiconductor substrate, a waveguide core layer stacked on the first cladding layer, and the second cladding layer stacked on the waveguide core layer,
   each of the first cladding layer, the active layer, the waveguide core layer, and the second cladding layer is formed of a semiconductor, and
   the diffraction grating is formed in the first cladding layer or the second cladding layer in a region of the semiconductor optical amplifier integrated device where the distributed Bragg reflector is formed.

7. The tunable laser source as claimed in claim 6, further comprising:
   a bottom electrode on a surface of the semiconductor substrate facing away from the first cladding layer;
   a first electrode on the first semiconductor optical amplifier;
   a second electrode on the second semiconductor optical amplifier; and
   a third electrode on the third semiconductor optical amplifier,
   wherein the second semiconductor optical amplifier and the third semiconductor optical amplifier are configured to be independently supplied with an electric current from the second electrode and the third electrode, respectively.

8. The tunable laser source as claimed in claim 1, wherein the tunable filter includes a plurality of wavelength filters each configured to select periodic wavelengths, and is configured to variably select a wavelength because of a Vernier effect due to the plurality of wavelength filters.

9. The tunable laser source as claimed in claim 1, further comprising:
a fourth semiconductor optical amplifier closer to the second end face than the first semiconductor optical amplifier,
wherein the partially reflecting mirror and the optical divider are disposed between the first semiconductor optical amplifier and the second, third, and fourth semiconductor optical amplifiers,
the optical divider further includes a branch connected to the fourth semiconductor optical amplifier,
the optical divider is configured to divide a laser beam emitted through the partially reflecting mirror into a first laser beam, a second laser beam, and a third laser beam, and
the first, second, and third laser beams enter the second, third, and fourth semiconductor optical amplifiers, respectively, to be amplified to exit from the second end face of the semiconductor optical amplifier integrated device.

10. The tunable laser source as claimed in claim 1, wherein
the semiconductor optical amplifier integrated device is disposed on a silicon substrate, and
the tunable filter and the mirror are formed of a silicon waveguide formed in a surface of the silicon substrate.

11. An optical transmitter, comprising:
the tunable laser source as set forth in claim 10, and
a coherent optical modulator formed of another silicon waveguide formed in the surface of the silicon substrate.

12. An optical transmitter and receiver module, comprising:
the optical transmitter as set forth in claim 11;
a first light-receiving element configured to detect a part of a laser beam emitted from the second semiconductor optical amplifier; and
a second light-receiving element configured to detect a part of a laser beam emitted from the third semiconductor optical amplifier.

13. The optical transmitter and receiver module as claimed in claim 12, further comprising:
a first power supply configured to supply an electric current to the first semiconductor optical amplifier;
a second power supply configured to supply an electric current to the second semiconductor optical amplifier;
a third power supply configured to supply an electric current to the third semiconductor optical amplifier; and
a controller configured to control the electric current supplied by the second power supply to the second semiconductor optical amplifier based on a power of the part of the laser beam detected at the first light-receiving element, and to control the electric current supplied by the third power supply to the third semiconductor optical amplifier based on a power of the part of the laser beam detected at the second light-receiving element.

14. An optical transmitter and receiver module, comprising:
the tunable laser source as set forth in claim 1;
a transmitter including a coherent optical modulator; and
a coherent receiver,
wherein a laser beam emitted from the second semiconductor optical amplifier enters the coherent optical modulator, and
wherein a laser beam emitted from the third semiconductor optical amplifier enters the coherent receiver as local oscillation light.

15. The optical transmitter and receiver module as claimed in claim 14, further comprising:
a first light-receiving element configured to detect a part of the laser beam emitted from the second semiconductor optical amplifier; and
a second light-receiving element configured to detect a part of the laser beam emitted from the third semiconductor optical amplifier.

16. The optical transmitter and receiver module as claimed in claim 15, further comprising:
a first power supply configured to supply an electric current to the first semiconductor optical amplifier;
a second power supply configured to supply an electric current to the second semiconductor optical amplifier;
a third power supply configured to supply an electric current to the third semiconductor optical amplifier; and
a controller configured to control the electric current supplied by the second power supply to the second semiconductor optical amplifier based on a power of the part of the laser beam detected at the first light-receiving element, and to control the electric current supplied by the third power supply to the third semiconductor optical amplifier based on a power of the part of the laser beam detected at the second light-receiving element.

* * * * *